(12) United States Patent
Shen et al.

(10) Patent No.: US 11,658,026 B2
(45) Date of Patent: May 23, 2023

(54) CONFORMAL SILICON OXIDE FILM DEPOSITION

(71) Applicant: Applied Materials, Inc., Santa Clara, CA (US)

(72) Inventors: Zeqing Shen, San Jose, CA (US); Bo Qi, San Jose, CA (US); Abhijit Basu Mallick, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 307 days.

(21) Appl. No.: 17/078,985

(22) Filed: Oct. 23, 2020

(65) Prior Publication Data

US 2022/0130658 A1   Apr. 28, 2022

(51) Int. Cl.
*H01L 21/02* (2006.01)
*C23C 16/40* (2006.01)

(52) U.S. Cl.
CPC ........ *H01L 21/0228* (2013.01); *C23C 16/401* (2013.01); *H01L 21/02164* (2013.01); *H01L 21/02211* (2013.01)

(58) Field of Classification Search
None
See application file for complete search history.

(56) References Cited

U.S. PATENT DOCUMENTS

| | | |
|---|---|---|
| 5,861,197 A | 1/1999 | Law et al. |
| 6,630,413 B2 | 10/2003 | Todd |
| 6,884,464 B2 | 4/2005 | Luo et al. |
| 9,875,888 B2 | 1/2018 | Yan et al. |
| 2011/0014798 A1 | 1/2011 | Mallick et al. |
| 2015/0014823 A1 | 1/2015 | Mallikarjunan et al. |
| 2017/0092492 A1 | 3/2017 | Zhao et al. |
| 2022/0238325 A1* | 7/2022 | Agnew ............... C23C 16/402 |

FOREIGN PATENT DOCUMENTS

| | | |
|---|---|---|
| KR | 20160052357 A | 5/2016 |
| WO | 2018063825 A1 | 4/2018 |

OTHER PUBLICATIONS

PCT International Search Report and Written Opinion in PCT/US2021/055124 dated Feb. 4, 2022, 12 pages.
Smith, Jacob W., et al., "Disilane-Based Low Thermal Budget Silicon Dioxide Chemical Vapor Deposition Process in a Single-Wafer Chamber", Electrochem. Solid-State Lett. 9 G141, 2006.

* cited by examiner

*Primary Examiner* — Asok K Sarkar
(74) *Attorney, Agent, or Firm* — Servilla Whitney LLC

(57) ABSTRACT

Methods for depositing a silicon-containing film on a substrate are described. The method comprises heating a processing chamber to a temperature greater than or equal to 200° C.; maintaining the processing chamber at a pressure of less than or equal to 300 Torr; coflowing a silicon precursor and nitrous oxide ($N_2O$) into the processing chamber, and depositing a conformal silicon-containing film on the substrate. The silicon-containing film has dielectric constant (k-value) in a range of from about 3.8 to about 4.0, has a breakdown voltage of greater than 8 MV/cm at a leakage current of 1 $mA/cm^2$ and has a leakage current of less than 1 $nA/cm^2$ at 2 MV/cm.

20 Claims, 2 Drawing Sheets

CONFORMAL SILICON OXIDE FILM DEPOSITION

TECHNICAL FIELD

Embodiments of the present disclosure pertain to the field of electronic device manufacturing, and in particular, to an integrated circuit (IC) manufacturing. More particularly, embodiments of the disclosure provide methods of depositing conformal silicon oxide films by chemical vapor deposition.

BACKGROUND

Integrated circuits have evolved into complex devices that can include millions of transistors, capacitors, and resistors on a single chip. The evolution of chip designs continually requires faster circuitry and greater circuit density. The demands for faster circuits with greater circuit densities impose corresponding demands on the materials used to fabricate such integrated circuits. In particular, as the dimensions of integrated circuit components are reduced, it is necessary to use low resistivity conductive materials as well as low dielectric constant insulating materials to obtain suitable electrical performance from such components.

Deposition of films on a substrate surface is an important process in a variety of industries including semiconductor processing, semiconductor manufacturing equipment, diffusion barrier coatings, and dielectrics for magnetic read/write heads. In the semiconductor industry, as an example, miniaturization requires atomic level control of thin film deposition to produce conformal coatings on high aspect structures.

One method for deposition of films is atomic layer deposition (ALD). Most ALD processes are based on binary reaction sequences, where each of the two surface reactions occurs sequentially. Because the surface reactions are sequential, the two gas phase reactants are not in contact, and possible gas phase reactions that may form and deposit particles are limited. While ALD tends to result in more conformal films than traditional chemical vapor deposition (CVD), processes for ALD have been most effective for deposition of metal oxide and metal nitride films. The disclosed method improves thermal CVD deposition of conformal films to rival results obtained through ALD.

Forming high-quality, stable dielectric layers of silicon oxide has involved thermal reactions directly utilizing the silicon of the substrate, and CVD depositions utilizing various precursors and an oxygen source. These thermal and CVD depositions tend to require high temperatures that are not necessarily suitable for depositions on substrates that have undergone previous processing, or have progressed to back-end-of-line (BEOL) processes. Additionally, these films may have high leakage and poor dielectric performance. Films having smaller thicknesses are also difficult to produce by these methods. There is a need, therefore, for processes to form high-quality, conformal layers of silicon oxide that have low leakage and improved dielectric performance.

SUMMARY

Methods to deposit films are described. In one or more embodiments, a method of depositing a film comprises exposing a surface to a silicon precursor and an oxygen source at a temperature greater than or equal to 200° C. and at a pressure of less than or equal to 300 Torr to form a conformal silicon-containing film on the surface, the silicon-containing film having a breakdown voltage of greater than 8 MV/cm at a leakage current of $1E^{-3}$ A/cm$^2$ and a leakage current of less than $1*10^{-9}$ Å/cm$^2$ at 2 MV/cm.

One or more embodiments provide a method of depositing a film. The method comprises heating a processing chamber to a temperature greater than or equal to about 200° C., the reaction chamber comprising a substrate; maintaining the processing at a pressure of less than or equal to about 300 Torr; coflowing a silicon precursor and nitrous oxide (N$_2$O) into the reaction chamber; and depositing a conformal silicon-containing film on the substrate. The silicon-containing film has a dielectric constant (k-value) in a range of from about 3.8 to about 4.0, a breakdown voltage of greater than 8 MV/cm at a leakage current of 1 mA/cm$^2$ and a leakage current of less than 1 nA/cm$^2$ at 2 MV/cm.

One or more embodiments are directed to a non-transitory computer readable medium including instructions, that, when executed by a controller of a processing chamber, causes the processing chamber to perform operations of heat a processing chamber to a temperature greater than or equal to about 200° C. the processing chamber comprising a substrate; maintain the processing chamber at a pressure of less than or equal to about 300 Torr; coflow a silicon precursor and nitrous oxide (N$_2$O) into the reaction chamber, the silicon precursor selected one or more of disilane, trisilane, tetrasilane, and polysilane; and deposit a conformal silicon-containing film on the substrate. The silicon-containing film has a dielectric constant (k-value) in a range of from about 3.8 to about 4.0, a breakdown voltage of greater than 8 MV/cm at a leakage current of 1 mA/cm$^2$ and a leakage current of less than 1 nA/cm$^2$ at 2 MV/cm.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Figure 1A:
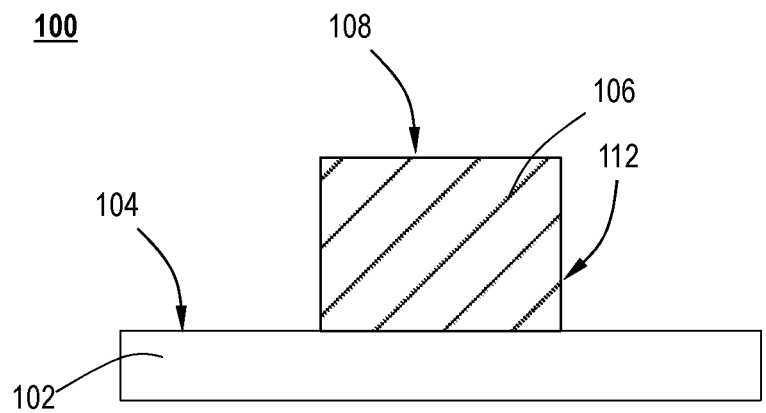
FIG. 1A illustrates a cross-sectional view of a substrate according to one or more embodiments.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate (or otherwise generate or graft target chemical moieties to impart chemical functionality), anneal and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. What a given substrate surface comprises will depend on what films are to be deposited, as well as the particular chemistry used.

As used in this specification and the appended claims, the terms "precursor", "reactant", "reactive gas" and the like are used interchangeably to refer to any gaseous species that can react with the substrate surface. In one or more embodiments, the precursor is a silicon based precursor.

One or more embodiments advantageously provide the formation of high-quality, stable dielectric layers of silicon oxide through the use of a thermal chemical vapor deposition (CVD) process. Additionally, the thermal CVD process of one or more embodiments forms high-quality, conformal layers of a silicon-containing film, e.g. silicon oxide, that have low leakage and improved dielectric performance.

One or more embodiments of the disclosure are described with reference to the Figures. FIG. 1A illustrates a cross-sectional view of a device 100 according to one or more embodiments. In one or more embodiments, a feature 106 is formed on a top surface 104 of substrate 102. The substrate 102 is provided for processing. As used in this specification and the appended claims, the term "provided" means that the substrate is made available for processing (e.g., positioned in a processing chamber). In some embodiments, the substrate 102 may comprise one or more of a semiconductor substrate, a processing chamber component, a workpiece, a pedestal, and a heater. As used herein, the term "workpiece" refers to any component, part of a component or device, or any object that can be integrated, into a larger and/or more complex component or device.

The Figures show substrates having a single feature for illustrative purposes; however, those skilled in the art will understand that there can be more than one feature. The shape of the feature 106 can be any suitable shape including, but not limited to, peaks, trenches, and vias. As used in this regard, the term "feature" means any intentional surface irregularity. Suitable examples of features include, but are not limited to trenches and vias, which have a top surface, at least one sidewall and a bottom surface, peaks which have a top surface 108 and at least one sidewall 112. Features can have any suitable aspect ratio (ratio of the depth of the feature to the width of the feature). In some embodiments, the aspect ratio is greater than or equal to about 5:1, 10:1, 15:1, 20:1, 25:1, 30:1, 35:1 or 40:1.

Figure 1B:
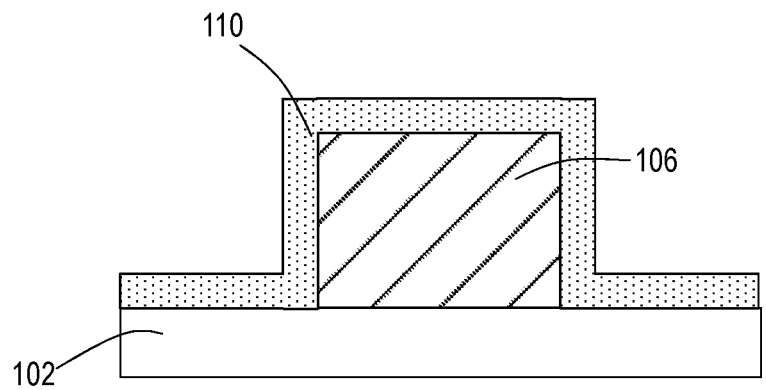
FIG. 1B illustrates a cross-sectional view of a substrate according to one or more embodiments.

Referring to FIG. 1B, a silicon-containing film 110 is deposited conformally on the top surface 104 of the substrate 102 and on the top surface 108 and on at least one sidewall 112 of the feature 106. In one or more embodiments, the silicon-containing film 110 is deposited by chemical vapor deposition. As used herein, "chemical vapor deposition" refers to a process in which a substrate surface is exposed to precursors and/or co-reagents simultaneous or substantially simultaneously. As used herein, "substantially simultaneously" refers to either co-flow or where there is overlap for a majority of exposures of the precursors.

In the CVD process of one or more embodiments, reactant gases, e.g. a silicon precursor and nitrous oxide source, are introduced into a reaction chamber. The reactant gases are then decomposed to create excited SH-radicals from the silicon precursor. The excited SH-radicals are chemically bound to the surfaces of the substrate and react with the nitrous oxide ($N_2O$), forming the silicon-containing film 110. The gaseous by-products of the reaction are then desorbed and removed from the reaction chamber.

In one or more embodiments, the silicon precursor comprises one or more of disilane, trisilane, tetrasilane, and a polysilane. As used herein, the term "polysilane" refers to a class of organic-inorganic polymers with a polymer backbone made up of silicon-silicon bonds with two substituents attached to each silicon atom. The substituents are typically hydrogen, alkyl, and/or aryl groups. For example, in some embodiments, a polysilane includes, but is not limited to, dimethyl-polysilane (DMPS), poly(methyl phenyl silane) (PMPS), poly(phenyl silane) (PPSi), decaphenyl cyclopentasilane (DPPS), and poly(dimethylsilylene) ($[CH_3)_2Si]_x$), and the like.

In one or more embodiments, the silicon precursor comprises disilane. In some embodiments, the silicon precursor comprises trisilane. In other embodiments, the silicon precursor comprises tetrasilane. In further embodiments, the silicon precursor comprises a polysilane.

In one or more embodiments, the surfaces 104, 108 are exposed to a silicon precursor and nitrous oxide ($N_2O$) at a temperature greater than or equal 200° C. and at a pressure of less than or equal to 300 Torr to form the conformal silicon-containing film 110 on the surfaces 104, 108.

In one or more embodiments, the temperature is greater than or equal to 400° C. In other embodiments, the temperature is greater than or equal to 200° C. Without intending to be bound by theory, it is believed that the temperature is dependent upon the silicon precursor used and at what temperature the silicon precursor cracks. As recognized by the skilled artisan, the thermal cracking is a process in which a molecule (or compound) is subjected to a temperature to break the molecular bonds. In one or more embodiments, the silicon precursor comprises disilane, and the temperature is greater than or equal to 450° C. In other embodiments, the silicon precursor comprises trisilane, and the temperature is greater than or equal to 350° C. In other embodiments, the silicon precursor comprises one or more of tetrasilane and a polysilicon, and the temperature is greater than or equal to 200° C.

The thermal CVD process of one or more embodiments may be performed at a pressure in a range of from about 1 Torr to about 300 Torr, including a range of from about 1 Torr to about 200 Torr, or a range of from about 1 Torr to about 100 Torr. In one or more embodiments, the pressure is less than or equal to about 300 Torr.

In one or more embodiments, the silicon precursor and the nitrous oxide (N$_2$O) are coflowed with a carrier gas into the reaction chamber. The carrier gas may be any suitable carrier gas known to the skilled artisan. In one or more embodiments, the carrier gas comprises one or more of argon (Ar), helium (He), nitrogen (N$_2$), and hydrogen (H$_2$).

In one or more embodiments, the ratio of the silicon precursor and the nitrous oxide can be controlled to modify the silicon content of the silicon-containing film 110.

In one or more embodiments, the silicon-containing film 110 is a conformal film. As used in this specification and the appended claims, the term "conformal" means that the layer adapts to the contours of a feature or a layer. Conformality of a layer is typically quantified by a ratio of the average thickness of a layer deposited on the sidewalls of a feature to the average thickness of the same deposited layer on the field, or upper surface, of the substrate. Layers deposited by the methods described herein are observed to have a conformality of greater than about 30%, such as 70% or greater, about 7:10 or greater, such as about 80% or greater, about 4:5 or greater, to about 100%, about 1:1, or to about 200% or greater, about 2:1. In one or more embodiments, the conformality at an aspect ratio of 10:1 of a critical dimension (CD) opening of about 25 nm can be greater than about 90%.

In some embodiments, the silicon-containing film 110 is a continuous film. As used herein, the term "continuous" refers to a layer that covers an entire exposed surface without gaps or bare spots that reveal material underlying the deposited layer. A continuous layer may have gaps or bare spots with a surface area less than about 1% of the total surface area of the film. In some embodiments, the silicon-containing film 110 is a pinhole-free film. As used herein, the term "pinhole-free" refers to a layer that covers an entire exposed surface without gaps, bare spots, holes, pinholes, and the like that reveal material underlying the deposited layer. A pinhole-free layer may have holes or pinholes with a surface area less than about 1% of the total surface area of the film.

In one or more embodiments, the silicon-containing film has a dielectric constant, i.e. k-value, in a range of from about 3.8 to about 4.0. In one or more embodiments, the silicon-containing film 110 comprises silicon oxide (SiO$_x$). While the term "silicon oxide" may be used to describe the silicon-containing film 110, the skilled artisan will recognize that the disclosure is not restricted to a particular stoichiometry. For example, the terms "silicon oxide" and "silicon dioxide" may both be used to describe a material having silicon and oxygen atoms in any suitable stoichiometric ratio. In one or more embodiments, the silicon-containing film 110 comprises less than 10% hydrogen and has a silicon to oxygen ratio of 1:2. In some embodiments, the silicon-containing film 110 comprises less than about 8% hydrogen, or less than about 5% hydrogen.

In one or more embodiments, the silicon-containing film 110 advantageously has a breakdown voltage of greater than 8 MV/cm at a leakage current of 1E$^{-3}$ A/cm$^2$ and a leakage current of less than $1*10^{-9}$ Å/cm$^2$ at 2 MV/cm. In one or more embodiments, the silicon-containing film 110 advantageously has a breakdown voltage of greater than 9 MV/cm at a leakage current of 1E$^{-3}$ A/cm$^2$ and a leakage current of less than $1*10^{-9}$ Å/cm$^2$ at 2 MV/cm. In one or more embodiments, the silicon-containing film 110 advantageously has a breakdown voltage of greater than 10 MV/cm at a leakage current of 1E$^{-3}$ A/cm$^2$ and a leakage current of less than $1*10^{-9}$ Å/cm$^2$ at 2 MV/cm.

In one or more embodiments, the silicon-containing film 110 has a thickness in the range of from about 5 nm to about 5000 nm. In other embodiments, the silicon-containing film 110 has a thickness in the range of from about 5 nm to about 100 nm. In some embodiments, the silicon-containing film 110 has a thickness in a range of from about 1000 nm to about 5000 nm.

Figure 2:
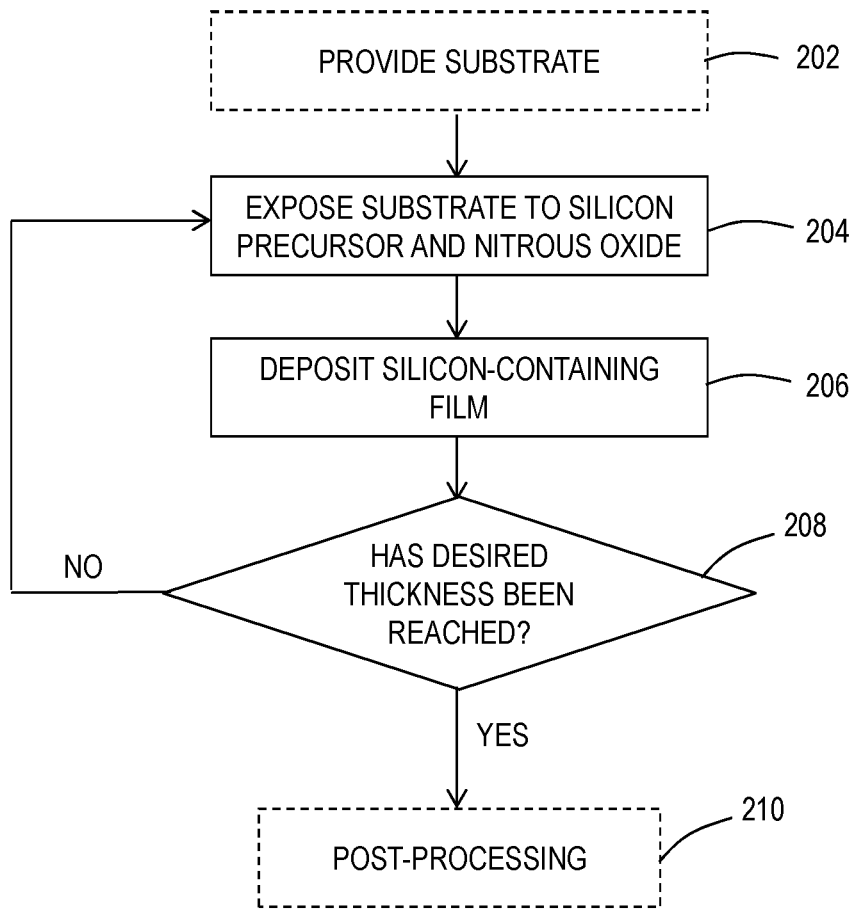
FIG. 2 illustrates a process flow diagram of a method according to one or more embodiments.

FIG. 2 illustrates a process flow diagram of a method 200 according to one or more embodiments. In one or more embodiments, at operation 202, a substrate is provided into a reaction chamber. It is noted that, in some embodiments, the substrate comprises a workpiece that may already be present in a reaction chamber. In one or more embodiments, at operation 204, the substrate is exposed to a silicon precursor and nitrous oxide. In some embodiments, the substrate is exposed to the silicon precursor and the nitrous oxide simultaneously or substantially simultaneously. At operation 206, a silicon-containing film is deposited on the substrate surface. At decision point 208, the thickness of the deposited film, or number of cycles of the process is considered. If the deposited film has reached a predetermined thickness or a predetermined number of process cycles have been performed, the method 200 moves to an optional post-processing operation 210. If the thickness of the deposited film or the number of process cycles has not reached the predetermined threshold, the method 200 returns to operation 204 to expose the substrate to a silicon precursor and nitrous oxide again.

The optional post-processing operation 210 can be, for example, a process to modify film properties (e.g., annealing) or a further film deposition process (e.g., additional ALD or CVD processes) to grow additional films. In some embodiments, the post-processing operation 210 can be a process that modifies a property of the deposited film. In some embodiments, the post-processing operation 210 comprises annealing the film. In some embodiments, annealing is done at temperatures in the range of about 300° C., 400° C., 500° C., 600° C., 700° C., 800° C., 900° C. or 1000° C. The annealing environment of some embodiments comprises one or more of an inert gas (e.g., molecular nitrogen (N$_2$), argon (Ar)) or a reducing gas (e.g., molecular hydrogen (H$_2$) or ammonia (NH$_3$)) or an oxidant, such as, but not limited to, oxygen (O$_2$), ozone (O$_3$), or peroxides. Annealing can be performed for any suitable length of time.

Embodiments described herein in reference to a thermal CVD process can be carried out using any suitable thin film deposition system. Examples of suitable systems include the PRECISION 5000® systems, PRODUCER® systems, PRODUCER® GTTM systems, PRODUCER® XP Precision™ systems, PRODUCER® SETM systems, all of which are commercially available from Applied Materials, Inc., of Santa Clara, Calif. Other tools capable of performing CVD processes may also be adapted to benefit from the embodiments described herein. In addition, any system enabling the thermal CVD processes described herein can be used to advantage. Any apparatus description described herein is illustrative and should not be construed or interpreted as limiting the scope of the implementations described herein.

In one or more embodiments, the CVD processing chamber may be controlled using a controller. The controller can be any suitable component that can control the processing chamber(s). For example, the controller can be a computer including a central processing unit (CPU), memory, inputs/outputs, suitable circuits, and storage.

Processes may generally be stored in the memory of the controller as a software routine that, when executed by the processor, causes the process chamber to perform processes of the present disclosure. The software routine may also be stored and/or executed by a second processor that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the CVD processing chamber is part of a tool for processing one or more substrates. In some embodiments, the CVD processing chamber is in a modular system comprising multiple chambers which perform various functions including substrate center-finding and orientation, degassing, annealing, deposition and/or etching. According to one or more embodiments, the modular system includes at least a first processing chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known modular systems which may be adapted for the present disclosure are the PRODUCER® XP Precision and the PRECISION 5000® systems, both available from Applied Materials, Inc., of Santa Clara, Calif.

One or more embodiments of the disclosure are directed to a non-transitory computer readable medium including instructions, that, when executed by a controller of a processing chamber, causes the processing chamber to perform operations of: heat a processing chamber to a temperature greater than or equal to about 200° C. the processing chamber comprising a substrate; maintain the processing chamber at a pressure of less than or equal to about 300 Torr; coflow a silicon precursor and nitrous oxide ($N_2O$) into the processing chamber, the silicon precursor selected from one or more of disilane, trisilane, tetrasilane, and polysilane; and deposit a conformal silicon-containing film on the substrate, the conformal silicon-containing film having a dielectric constant (k-value) in a range of from about 3.8 to about 4.0, having a breakdown voltage of greater than 8 MV/cm at a leakage current of 1 mA/cm$^2$ and having a leakage current of less than 1 nA/cm$^2$ at 2 MV/cm.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of depositing a film, the method comprising:
exposing a surface to a thermal chemical vapor deposition (CVD) process, the thermal CVD process comprising exposing the surface to a silicon precursor and nitrous oxide ($N_2O$) at a temperature greater than or equal 200° C. and at a pressure of less than or equal to 300 Torr to form a conformal silicon-containing film on the surface, the conformal silicon-containing film having a breakdown voltage of greater than 8 MV/cm at a leakage current of 1 mA/cm$^2$ and a leakage current of less than 1 nA/cm$^2$ at 2 MV/cm.

2. The method of claim 1, wherein the silicon precursor comprises one or more of disilane, trisilane, tetrasilane, and a polysilane.

3. The method of claim 1, wherein the silicon precursor comprises disilane and the temperature is greater than or equal to 400° C.

4. The method of claim 1, wherein the silicon precursor comprises trisilane and the temperature is greater than or equal to 350° C.

5. The method of claim 1, wherein the silicon precursor comprises tetrasilane or polysilane and the temperature is greater than or equal to 200° C.

6. The method of claim 1, wherein the pressure is in a range of from 1 Ton to about 300 Ton.

7. The method of claim 1, wherein the conformal silicon-containing film has a dielectric constant (k-value) in a range of from about 3.8 to about 4.0.

8. The method of claim 1, wherein the silicon precursor and the nitrous oxide are coflowed in a carrier gas.

9. The method of claim 8, wherein the carrier gas comprises one or more of argon (Ar), helium (He), nitrogen ($N_2$), and hydrogen ($H_2$).

10. The method of claim 1, wherein the surface comprises one or more of a semiconductor substrate, a processing chamber component, a workpiece, a pedestal, and a heater.

11. The method of claim 10, wherein the one or more of a semiconductor substrate, a workpiece, a pedestal, and a heater comprises at least one feature thereon.

12. The method of claim 11, wherein the at least one feature is selected from a peak, a trench, and a via.

13. The method of claim 1, wherein the conformal silicon-containing film comprises silicon oxide ($SiO_x$).

14. The method of claim 1, wherein the conformal silicon-containing film comprises less than 10% hydrogen and silicon to oxygen ratio of 1:2.

15. A method of depositing a film, the method comprising:
heat a processing chamber to a temperature greater than or equal to about 200° C., the processing chamber comprising a substrate;
maintain the processing chamber at a pressure of less than or equal to about 300 Torr;
perform a thermal chemical vapor deposition (CVD) process to coflow a silicon precursor and nitrous oxide ($N_2O$) into the processing chamber; and
deposit a conformal silicon-containing film on the substrate, the conformal silicon-containing film having a dielectric constant (k-value) in a range of from about 3.8 to about 4.0, having a breakdown voltage of greater than 8 MV/cm at a leakage current of 1 mA/cm$^2$ and having a leakage current of less than 1 nA/cm$^2$ at 2 MV/cm.

16. The method of claim 15, wherein the conformal silicon-containing film as a thickness in a range of from about 5 nm to about 5000 nm.

17. The method of claim 15, wherein the silicon precursor comprises one or more of disilane, trisilane, tetrasilane, and a polysilane.

18. The method of claim 15, wherein the conformal silicon-containing film comprises less than 10% hydrogen (H) and silicon to oxygen ratio of 1:2.

19. The method of claim 15, wherein the silicon precursor and the nitrous oxide are coflowed in a carrier gas, the carrier gas comprising one or more of argon (Ar), helium (He), nitrogen ($N_2$), and hydrogen ($H_2$).

20. A non-transitory computer readable medium including instructions, that, when executed by a controller of a processing chamber, causes the processing chamber to perform operations of:
heat a processing chamber to a temperature greater than or equal to about 200° C. the processing chamber comprising a substrate;
maintain the processing chamber at a pressure of less than or equal to about 300 Torr;
perform a thermal chemical vapor deposition (CVD) process to coflow a silicon precursor and nitrous oxide ($N_2O$) into the processing chamber, the silicon precursor selected from one or more of disilane, trisilane, tetrasilane, and polysilane; and
deposit a conformal silicon-containing film on the substrate, the conformal silicon-containing film having a dielectric constant (k-value) in a range of from about 3.8 to about 4.0, having a breakdown voltage of greater than 8 MV/cm at a leakage current of 1 mA/cm$^2$ and having a leakage current of less than 1 nA/cm$^2$ at 2 MV/cm.

* * * * *